(12) United States Patent
Kim et al.

(10) Patent No.: US 10,984,877 B1
(45) Date of Patent: Apr. 20, 2021

(54) MULTI BLCS FOR MULTI-STATE VERIFY AND MULTI-LEVEL QPW

(71) Applicant: SanDisk Technologies LLC, Addison, TX (US)

(72) Inventors: Jongyeon Kim, San Jose, CA (US); Hiroki Yabe, San Jose, CA (US); Kou Tei, San Jose, CA (US); Chia-Kai Chou, San Jose, CA (US); Ohwon Kwon, San Jose, CA (US)

(73) Assignee: SanDiskTechnologies LLC, Addison, TX (US)

( * ) Notice: Subject to any disclaimer, the term of this patent is extended or adjusted under 35 U.S.C. 154(b) by 0 days.

(21) Appl. No.: 16/717,233

(22) Filed: Dec. 17, 2019

(51) Int. Cl.
*G11C 16/34* (2006.01)
*G11C 16/04* (2006.01)
*G11C 16/26* (2006.01)
*G11C 11/56* (2006.01)
*G11C 16/10* (2006.01)
*G11C 16/24* (2006.01)

(52) U.S. Cl.
CPC ...... *G11C 16/3459* (2013.01); *G11C 11/5628* (2013.01); *G11C 11/5642* (2013.01); *G11C 11/5671* (2013.01); *G11C 16/0483* (2013.01); *G11C 16/10* (2013.01); *G11C 16/24* (2013.01); *G11C 16/26* (2013.01)

(58) Field of Classification Search
CPC ............ G11C 16/3459; G11C 16/0483; G11C 11/5671; G11C 16/24; G11C 16/10; G11C 16/26; G11C 11/5628; G11C 11/5642
See application file for complete search history.

(56) References Cited

U.S. PATENT DOCUMENTS

| | | | |
|---|---|---|---|
| 2012/0182804 A1* | 7/2012 | Hung | H01L 27/11578 365/185.13 |
| 2014/0241070 A1* | 8/2014 | Wang | G11C 11/5678 365/189.02 |
| 2015/0262701 A1* | 9/2015 | Takizawa | G11C 11/1659 365/96 |
| 2016/0189770 A1* | 6/2016 | Abe | G11C 16/0483 365/185.03 |

* cited by examiner

*Primary Examiner* — Ajay Ojha
(74) *Attorney, Agent, or Firm* — Dickinson Wright PLLC; Steven Hurles

(57) ABSTRACT

An apparatus and method for a multi-state verify of a memory array are provided. A sense circuit of a memory device is connected to a bit line of the memory array. The sense circuit includes a first voltage clamp, a second voltage clamp, and a program data latch disposed on the bit line. The first and second voltage clamps are biased to first and second voltages, respectively, where the first voltage is lower than the second voltage. When a high bias is applied to the program data latch, the program data latch is in an OFF state, and the first voltage clamp limits the bias on the bit line to the first voltage. When a low bias is applied to the program data latch, the program data latch is in an ON state, and the second voltage clamp limits the bias on the bit line to the second voltage.

20 Claims, 10 Drawing Sheets

| | Program Verify Odd State | Program Verify Even State | Read Odd State | Read Even State | Program with Normal VQPW | Program with Higher VQPW | Erase |
|---|---|---|---|---|---|---|---|
| BLC1 bias | VBLC1 | VBLC1 | VBLC1 | VBLC1 | VBLC1 | VBLC1 | VTH |
| BLC2 bias | VBLC2 | VBLC2 | VBLC2 | VBLC2 | VBLC2 | VBLC2 | VTH |
| PDL bias | VDDSA | VSS | VDDSA | VSS | VDDSA | VSS | VDDSA |
| PDL | OFF | ON | OFF | ON | OFF | ON | |
| BL clamp | VBLC1 | VBLC2 | VBLC1 | VBLC2 | VBLC1 | VBLC2 | n/a |

FIG. 10

MULTI BLCS FOR MULTI-STATE VERIFY AND MULTI-LEVEL QPW

BACKGROUND

Technical Field

Apparatuses and methods consistent with example embodiments relate to QLC NAND flash memory

Description of the Related Art

Three-dimensional (3D) Not-AND (NAND) flash memory is a type of non-volatile flash memory in which memory cells are stacked vertically in multiple layers. 3D NAND was developed to address challenges encountered in scaling two-dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an example 3D NAND memory array. In this example, the memory array is a 3D NAND memory array. However, this is just one example of a memory array. The memory array includes multiple physical layers that are monolithically formed above a substrate, such as a silicon substrate.

Storage elements, for example memory cells 1001, are arranged in arrays in the physical layers. A memory cell 1001 includes a charge trap structure between a word line 1050 and a conductive channel 1042. Charge can be injected into or drained from the charge trap structure via biasing of the conductive channel 1042 relative to the word line 1050. For example, the charge trap structure can include silicon nitride and can be separated from the word line 1050 and the conductive channel 1042 by a gate dielectric, such as a silicon oxide. An amount of charge in the charge trap structure affects an amount of current through the conductive channel 1042 during a read operation of the memory cell 1001 and indicates one or more bit values that are stored in the memory cell 1001.

The 3D memory array includes multiple blocks. Each block includes a "vertical slice" of the physical layers that includes a stack of word lines 1050. Multiple conductive channels 1042 (having a substantially vertical orientation, as shown in FIG. 1) extend through the stack of word lines 1050. Each conductive channel 1042 is coupled to a storage element in each word line 1050, forming a NAND string of storage elements, extending along the conductive channel 1042. FIG. 1 illustrates three blocks, five word lines 1050 in each block, and three conductive channels 1042 in each block for clarity of illustration. However, the 3D memory array can have more than three blocks, more than five word lines per block, and more than three conductive channels per block.

Physical block circuitry is coupled to the conductive channels 1042 via multiple conductive lines: bit lines, illustrated as a first bit line BL0, a second bit line BL1, and a third bit line BL2 at a first end of the conductive channels (e.g., an end most remote from the substrate) and source lines, illustrated as a first source line SL0, a second source line SL1, and a third source line SL2, at a second end of the conductive channels (e.g., an end nearer to or within the substrate). The physical block circuitry is illustrated as coupled to the bit lines BL0-BL2 via "P" control lines, coupled to the source lines SL0-SL2 via "M" control lines, and coupled to the word lines 1050 via "N" control lines. Each of P, M, and N can have a positive integer value based on the specific configuration of the 3D memory array.

Each of the conductive channels 1042 is coupled, at a first end to a bit line BL, and at a second end to a source line SL. Accordingly, a group of conductive channels 1042 can be coupled in series to a particular bit line BL and to different source lines SL.

It is noted that although each conductive channel 1042 is illustrated as a single conductive channel, each of the conductive channels 1042 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

Among other things, the physical block circuitry facilitates and/or effectuates read and write operations performed on the 3D memory array. For example, data can be stored to storage elements coupled to a word line 1050 and the circuitry can read bit values from the memory cells 1001.

In a QLC memory device, due to four bits being programmed per cell, as opposed to a single bit per cell as in SLC, the programming time tPROG is increased. In part, this long programming time is due to the numerous verify steps required for QLC.

SUMMARY

Example embodiments may address at least the above problems and/or disadvantages and other disadvantages not described above. Also, example embodiments are not required to overcome the disadvantages described above, and may not overcome any of the problems described above.

According to an aspect of an example embodiment, a sense circuit is connected to a bit line of a memory array. The sense circuit may comprise a first voltage clamp disposed on the bit line, the first voltage clamp configured to limit the bit line voltage to a first clamp voltage; a second voltage clamp disposed on the bit line, the second voltage clamp configured to limit the bit line voltage to a second clamp voltage, wherein the second clamp voltage is higher than the first clamp voltage; and a program data latch disposed on the bit line such that when a transistor of the program data latch is in an OFF state, the bit line is clamped by the first voltage clamp to the first clamp voltage and when the transistor of the program data latch is in an ON state, the bit line is clamped by the second voltage clamp to the second clamp voltage.

The sense circuit may further comprise a sense amplifier connected to a sense node of the bit line.

The program data latch may be a first program data latch, and the sense circuit may further comprise a third voltage clamp disposed on the bit line, the third voltage clamp configured to limit the bit line voltage to a third clamp voltage, wherein the third clamp voltage is higher than the second clamp voltage; and a second program data latch disposed on the bit line, such that when the transistor of the first program data latch is in the ON state and a transistor of the second program data latch is in an OFF state, the bit line is clamped by the second voltage clamp to the second clamp voltage, and when the transistor of the first program data latch is in the ON state, and the transistor of the second program data latch is in an ON state, the bit line is clamped by the third voltage clamp to the third clamp voltage.

According to an aspect of another example embodiment, a memory device is provided comprising a memory array of a plurality of memory cells; and the sense circuit described above.

According to an aspect of another example embodiment, a sense circuit connected to a bit line of a memory array comprises a first voltage clamp circuit configured to limit a voltage on a bit line to a first voltage; a second voltage clamp circuit configured to limit a voltage on a bit line to a second voltage, higher than the first voltage; and a sense amplifier comprising a clamp circuit, a cell current discriminator circuit, and a latch circuit, the sense amplifier configured to sense a conduction current of a memory cell connected to the bit line.

The sense circuit may further comprise an isolation transistor, disposed on the bit line and configured to cause one of the first voltage clamp circuit and the second voltage clamp circuit to bias the bit line.

The isolation transistor may be a data latch.

According to an aspect of an example embodiment, a program verify method comprises, in a sense circuit connected to a bit line of a memory array, simultaneously sensing a conduction current of a first cell of a memory array by biasing a first bit line, connected to the first cell, to a first voltage, and sensing a conduction current of a second cell of the memory array by biasing a second bit line, connected to the second cell, to a second voltage, less than the first voltage. According to an aspect of another example embodiment, a program verify method comprises clamping a voltage of a bit line of a memory array to a first clamp voltage and sensing a conduction current of a first memory cell connected to the bit line; and clamping a voltage of the bit line of the memory array to a second clamp voltage, higher than the first clamp voltage, and sensing a conduction current of a second memory cell connected to the bit line.

BRIEF DESCRIPTION OF THE DRAWINGS

The above and/or other aspects will become apparent and more readily appreciated from the following description of example embodiments, taken in conjunction with the accompanying drawings in which:

FIG. 10 is a chart illustrating the biases applied to the different elements of the sense module of FIG. 9, in different verify and read states, according to an example embodiment.

DETAILED DESCRIPTION

Figure 1:
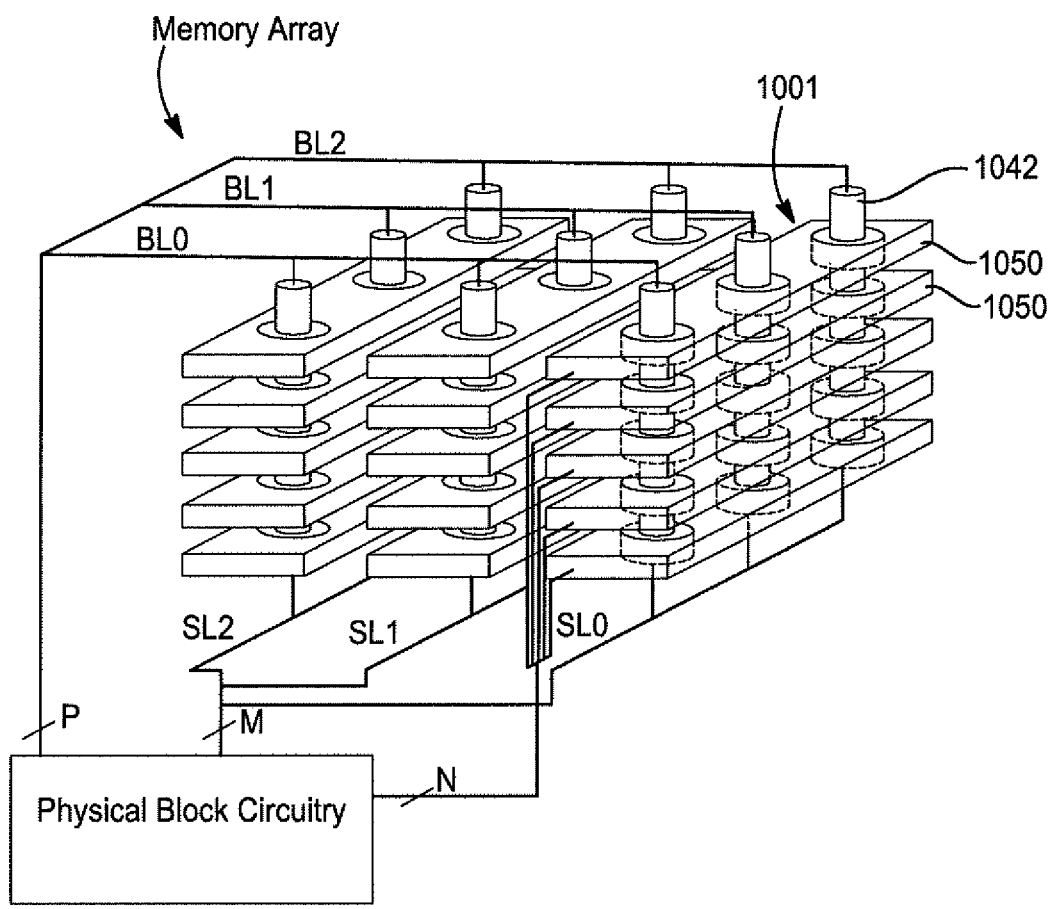
FIG. 1 illustrates a diagram of an example 3D NAND memory array.

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

Figure 2:
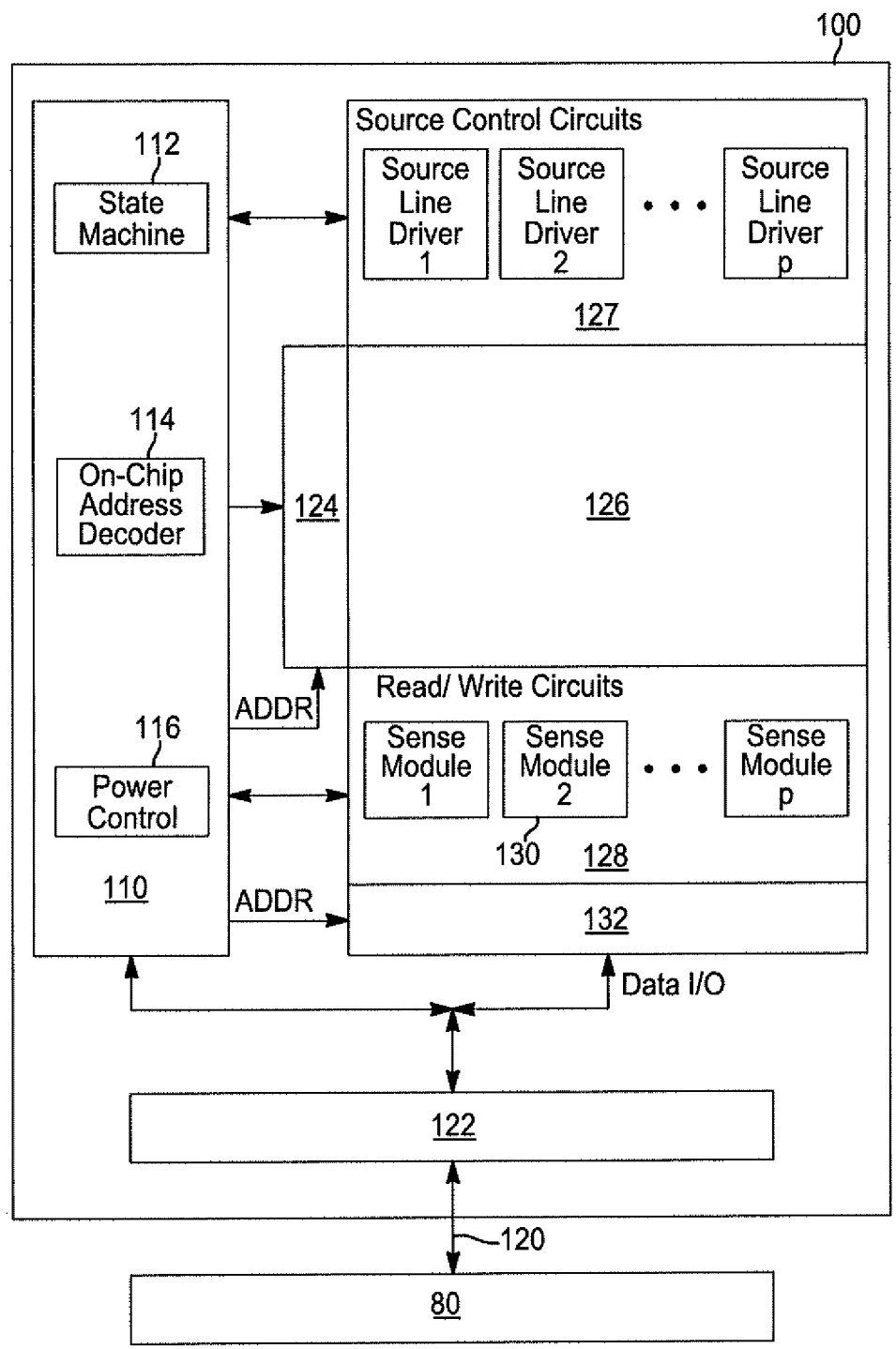
FIG. 2 is a schematic diagram illustrating an example of a memory device.

FIG. 2 is a schematic diagram illustrating an example of a memory device 100. The memory device 100 includes a memory array 126 of memory cells, such as a two-dimensional array of memory cells or a three-dimensional array of memory cells. The memory array 126 may include memory cells according to a NAND flash type architecture or a NOR flash type architecture. Memory cells in a NAND configuration are accessed as a group and are typically connected in series. A NAND memory array is composed of multiple strings in which each string is composed of multiple memory cells sharing a bit line and accessed as a group. Memory cells in a NOR configuration may be accessed individually. NAND flash and NOR flash memory cells may be configured for long-term storage of information as non-volatile memory retaining information after power on/off cycles. The memory array 126 may also be other types of memory cells programmable to store multiple bits of data per cell as non-volatile memory or volatile memory and may be other types of memory cells in other configurations besides NAND or NOR configurations. The memory device 100 may include multiple dies of memory arrays 126.

The memory array 126 is addressable by word lines via a row decoder 124 and by bit lines via a column decoder 132. The row decoder 124 selects one or more word lines and the column decoder 132 selects one or more bit lines in order to apply appropriate voltages to the respective gates/drains of the addressed memory transistor.

The read/write circuits 128 are provided to read or write (program) the memory states of addressed memory transistors. The read/write circuits 128 include multiple sense modules 130 (sensing circuitry) that allow a page (or other unit) of memory cells to be read or sensed in parallel. Each sense module 130 includes bit line drivers and circuits for sensing.

Control circuitry 110 cooperates with the read/write circuits 128 to perform memory operations on the memory array 126. Control circuitry 110 may include a state machine 112, an on-chip address decoder 114, and a power control module 116. The state machine 112 provides chip-level control of memory operations. The on-chip address decoder 114 provides an address interface between a host or a memory controller and the hardware address used by decoders 124 and 132. The power control module 116 controls the power and voltages supplied to the word lines and bit lines during memory operations. Control circuitry 110 may include drivers for word lines, source side select lines (SGS), drain side select lines (SGD), and source lines. Control circuitry 110 is also in communication with source control circuits 127, which include source line driver circuits used to drive various voltages on the individual source lines.

The memory device 100 includes a controller 122 which operates with a host 80 through a link 120. Commands and data are transferred between the host and the controller 122 via the link 120. The link 120 may include a connection (e.g., a communication path), such as a bus or a wireless connection.

The memory device 100 may be used as storage memory, a main memory, a cache memory, a backup memory, or a redundant memory. The memory device 100 may be an internal storage drive, such as a notebook hard drive or a desktop hard drive. The memory device 100 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. The memory device 100 may take the form of an embedded mass storage device, such as an eSD/eMMC embedded flash drive, embedded in host 80. The memory device 100 may also be any other type of internal storage device, removable storage device, embedded storage device, external storage device, or network storage device, as would be understood by one of skill in the art.

The memory device 100 may be directly coupled to the host 80 or may be indirectly coupled to the host 80 via a network. For example, the network may include a data center storage system network, an enterprise storage system network, a storage area network, a cloud storage network, a local area network (LAN), a wide area network (WAN), the Internet, and/or another network.

Instructions may be executed by any of various components of memory device 100, such as by the controller 100, controller circuitry 110, the row decoder 124, the column decoder 132, read/write circuits 128, source control circuits 127, logic gates, switches, latches, application specific integrated circuits (ASICs), programmable logic controllers, embedded microcontrollers, and other components of memory device 100.

Figure 3:
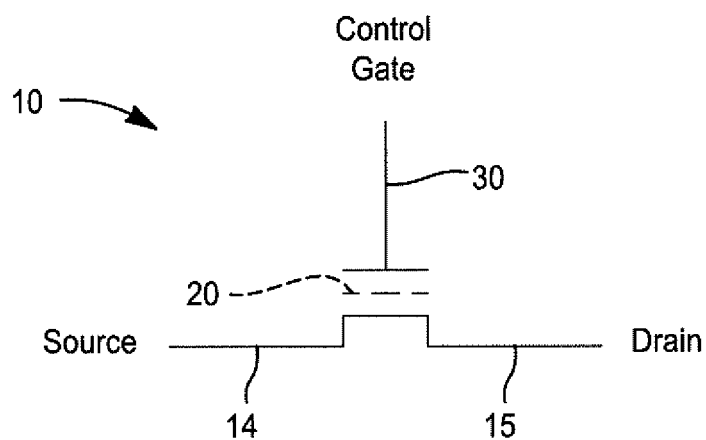
FIG. 3 is a schematic diagram illustrating an example of a flash non-volatile memory cell 10.

FIG. 3 is a schematic diagram illustrating an example of a flash non-volatile memory cell 10. The memory cell 10 can be implemented by a field-effect transistor having a charge storage unit 20, such as a floating gate or a dielectric layer. Memory cell 10 also includes a source 14, a drain 16, and a control gate 30. A memory state of memory cell 10 may be read by sensing the conduction current across the source and drain electrodes of the cell when a reference voltage is applied to the control gate 30. For each given charge on the floating gate of a cell, a corresponding conduction current with respect to a fixed reference control gate voltage may be detected. A range of charge programmable onto the floating gate defines a corresponding threshold voltage window or a corresponding conduction current window of the memory states of the memory cell 10.

Figure 4:
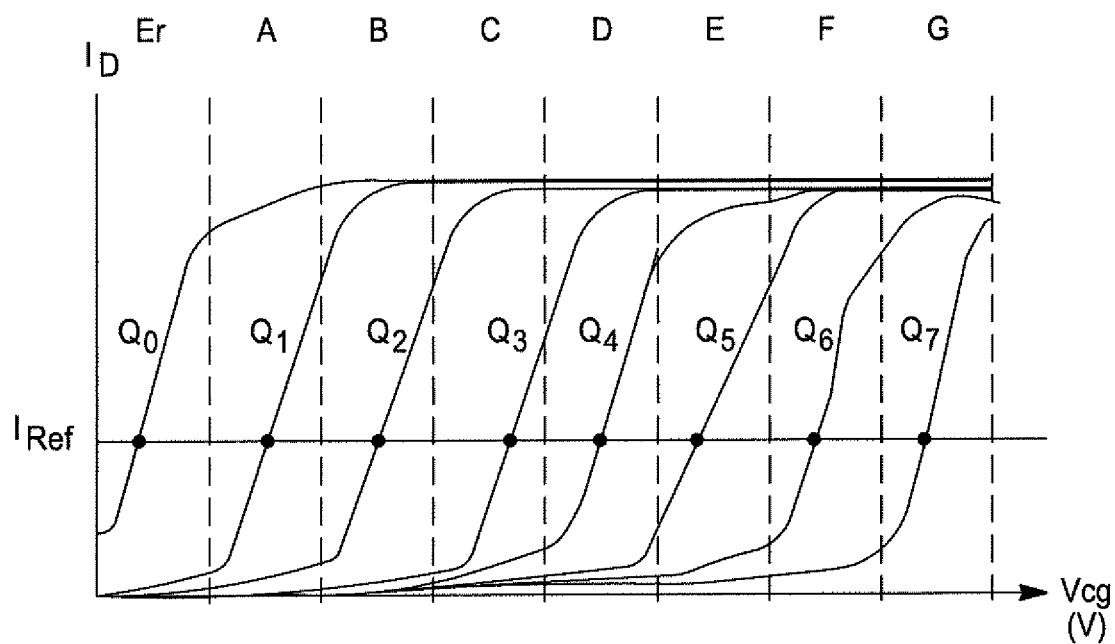
FIG. 4 is a schematic diagram illustrating an example of a relation between a source-drain current and a control gate voltage for eight different charge levels of a memory cell.

FIG. 4 is a schematic diagram illustrating an example of the relation between a source-drain current $I_D$ and a control gate voltage $V_{CG}$ for eight different charge levels $Q_0$-$Q_7$ that the floating gate of a memory cell, such as memory cell 10 of FIG. 3, may be selectively storing at any one time. The eight curves represent eight charge levels on a floating gate of a memory cell corresponding to eight possible memory states. Eight possible memory states representing one erased memory state ER and seven programmed states A, B, C, D, E, F, and G may be demarcated by partitioning the threshold window into eight regions. For example, if a reference current $I_{REF}$ is used, then a cell programmed with a charge level Qi may be considered to be in an A memory state since its curve intersects with $I_{REF}$ in the region of the A threshold voltage window. If a reference current $I_{REF}$ is used, then a cell programmed with a charge level $Q_3$ may be considered to be in a C memory state since its curve intersects with $I_{REF}$ in the region of the C threshold voltage window.

Figure 5:
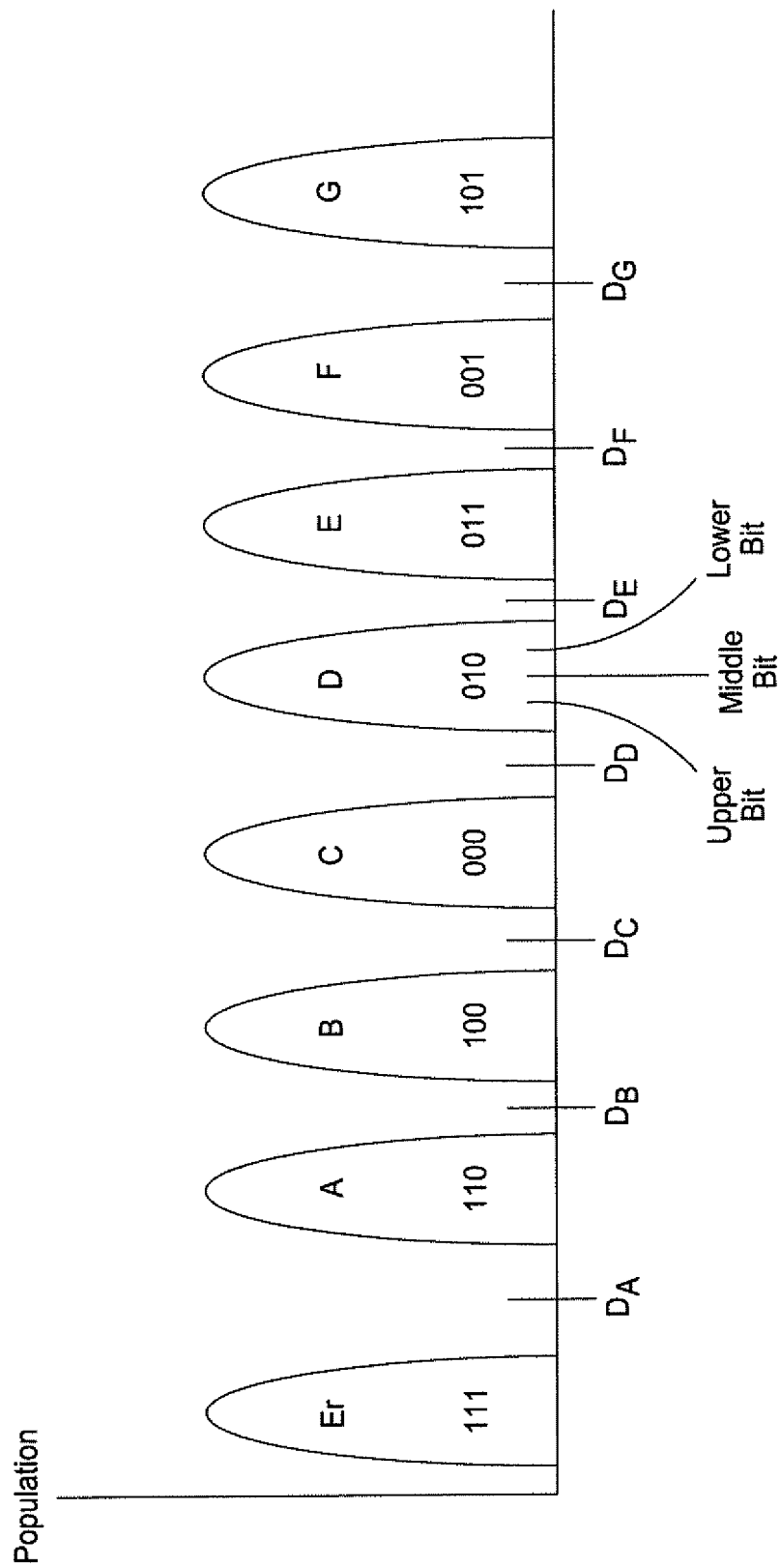
FIG. 5 is a schematic diagram illustrating an example of threshold voltage distributions of a memory array with memory cells operable in eight memory states.

FIG. 5 is a schematic diagram illustrating an example of threshold voltage distributions of a memory array with memory cells operable in eight memory states. The possible threshold voltages of each memory cell span a threshold window which is partitioned into eight regions to demarcate eight possible memory states: "Er," "A," "B," "C," "D," "E," "F," and "G." "Er" is an erased state or a ground state and "A" through "G" are seven progressively programmed states. During a read operation, the eight states may be demarcated by seven demarcation breakpoints, $D_A$, $D_B$, $D_C$, $D_D$, $D_E$, $D_F$, and $D_G$.

FIG. 5 also shows an example of 3-bit gray coding represented by the eight possible memory states. Each of the eight memory states represent a triplet of upper, middle, and lower bits. Here, an erased memory state represents "111," A memory state represents "110," B memory state represents "100," C memory state represents "000," D memory state represents "010," E memory state represents "011," F memory state represents "001," and G memory state represents "101." The three code bits, "lower," ""middle," and "upper" bits, may be read or programmed separately. For example, in a first round, the lower bits of the memory cells may be read. In a second round, the middle bits of the memory cells may be read. In a third round, the upper bits of the memory cells may be read. Similarly, in programming, in a first round the lower bits of the memory cells may be programmed and verified. In a second round the middle bits of the memory cells may be programmed and verified. In a third round the upper bits of the memory cells may be programmed and verified.

FIGS. 4 and 5 show a memory cell having eight memory states and operating as a TLC storing three bits per cell. Alternately, a memory cell may have more than eight memory states. For example, a memory cell may have sixteen memory states operating as a QLC storing four bits per cell.

Figure 6:
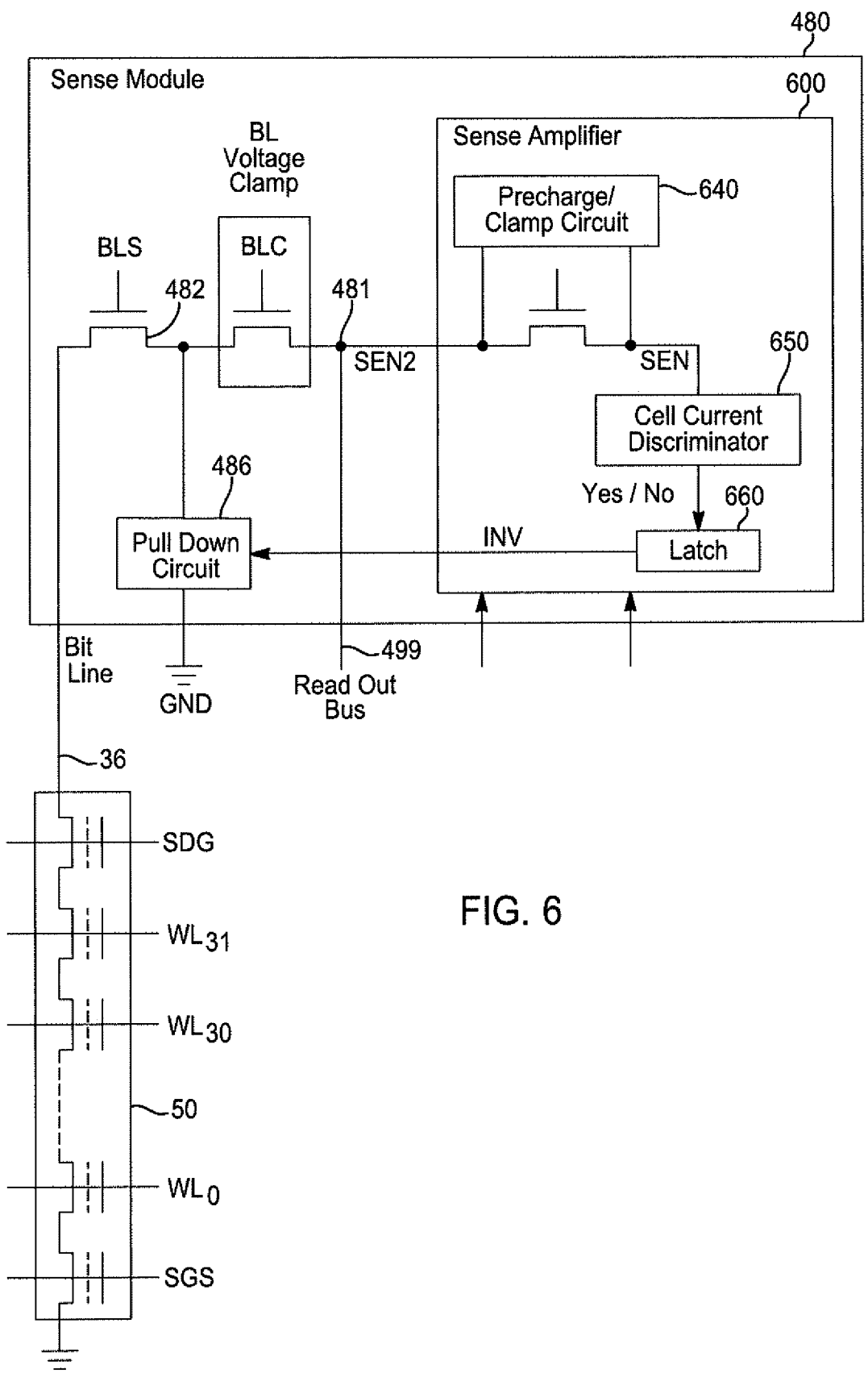
FIG. 6 is a schematic diagram illustrating an example of a sense module 480 for sensing a conduction current of a NAND memory cell for read operations or verify operations.

FIG. 6 is a schematic diagram illustrating an example of a sense module 480 for sensing a conduction current of a NAND memory cell for read operations or verify operations. The sense module 480 senses the conduction current of a memory cell in a NAND chain 50 via a coupled bit line 36. A sense node 481 may be selectively coupled to a bit line, a sense amplifier 600, and a readout bus 499. An isolation transistor 482, when enabled by a signal BLS, connects the bit line 36 to the sense node 481. The sense amplifier 600 senses the sense node 481. The sense amplifier 600 may include a precharge/clamp circuit 640 and a cell current discriminator 650. The sense module 480 enables the conduction current of the selected memory cell in the NAND chain to be sensed and the sensed results to be stored in a latch 660. A pull-down circuit 486 may selectively pull bit line 36 (or connect to SGS transistor source node value if the NAND chain source is set to non-zero) to ground to enable the locking out of bit lines in a high current state based upon the sensed results.

When a memory cell is programmed, a verify operation is performed for each possible state. Thus, for a QLC, with four bits programmed, there are sixteen different states, and sixteen different verify operations need to be performed. Thus, when QLC are used, the verify operations become very time consuming in the overall programming flow.

According to one or more example embodiments, the use, in the sense module, of one additional bit line clamp (BLC) and data latch (DL) may enable a fifty percent reduction in the number of verify operations, while maintaining a small overall architecture. Also, according to one of more example embodiments, the use of two or more BLCs and DLs may enable a sixty percent or more reduction in the number of verify operations required. The example embodiments described herein may be particularly applicable to QLC CuA products, though are not limited to these.

Figures 7A, 7B:
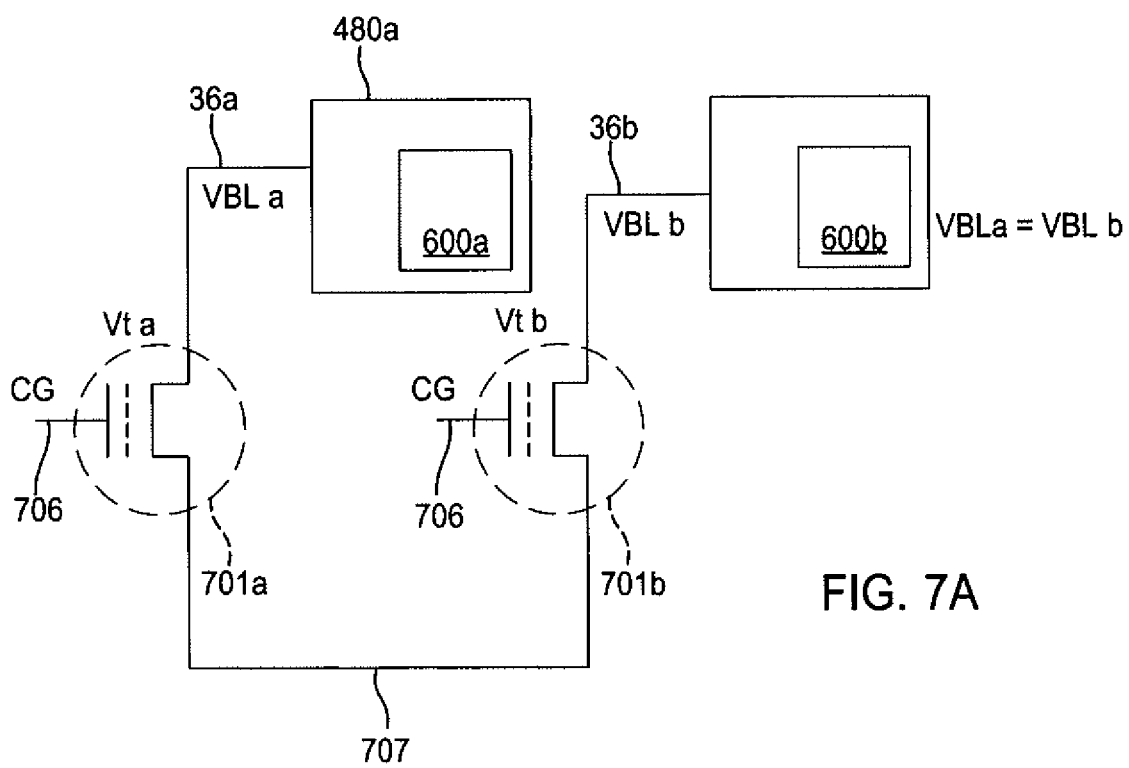
FIG. 7A illustrates two memory cells according to a related art verify operation.
FIG. 7B illustrates the number of operations (loops) required to verify memory cells according to the verify operation of FIG. 7A.

There are three different types of 3D cell architecture structures: CMOS next-to Array (CnA), CMOS under Array (CuA), and CMOS adjacent to Array (CaA). Regardless of the cell architecture, there is a continuing need for increased memory density for future generations of memory devices. Thus, with a CuA architecture, the circuits are disposed underneath the memory chip, providing additional chip real estate for additional components and other transistors FIG. 7A illustrates two cells according to a related art verify operation. Two cells 701a and 701b are illustrated, and they are connected, respectively, to bit lines 36a and 36b. The bit lines 36a and 36b are provided with voltages VBLa and VBLb, respectively. The same VBL are applied to both cells 701a and 701b, and therefore, in order to verify both of the cells, the control gate (CG) 706 voltage must be changed. A first CG voltage level is applied to the cells in order to read the first cell 701a voltage Vta, and a second CG voltage level is applied to the cells in order to read the second cell 701b voltage Vtb.

FIG. 7B illustrates the number of operations (loops) required to verify cells according to the verify operation of FIG. 7A.

Figures 8A, 8B:
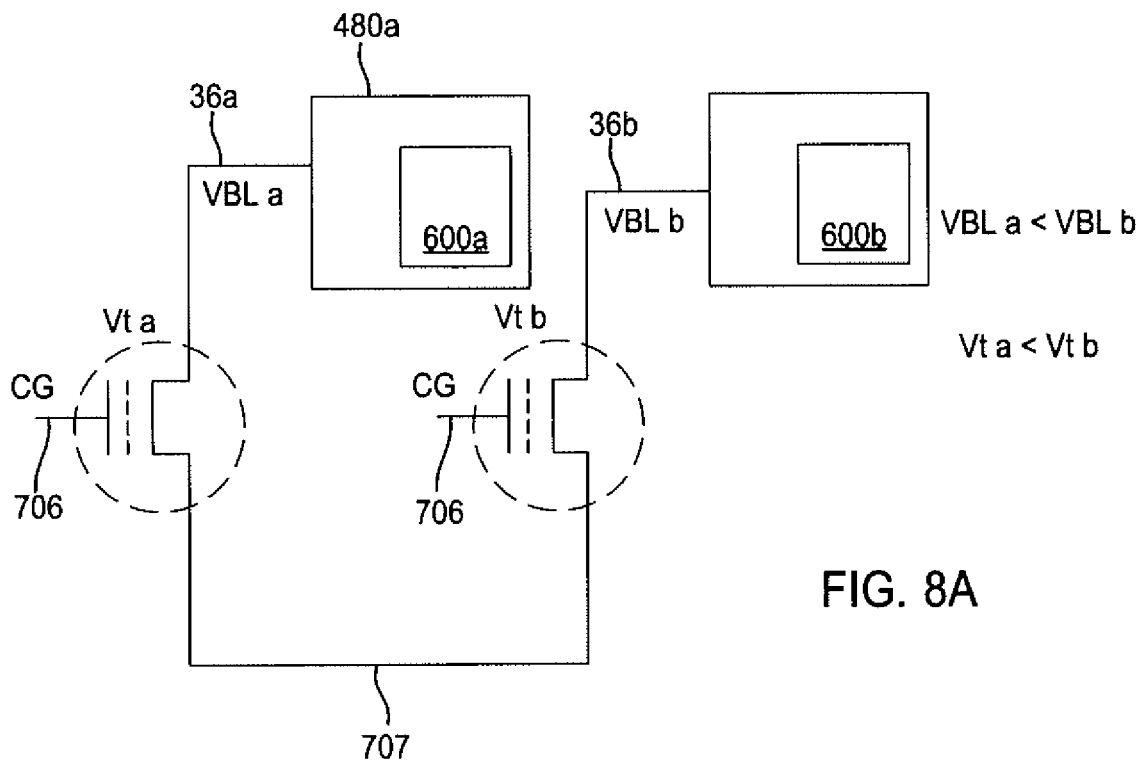
FIG. 8A illustrates two memory cells according to a verify operation according to an example embodiment.
FIG. 8B illustrates the number of operations (loops) required to verify memory cells according to the example embodiment of FIG. 8A.

FIG. 8A illustrates two cells according to a verify operation according to an example embodiment. According to this example embodiment, two different VBL are applied to the different bit lines, for example, VBLa is less than VBLb. In this case, the two states of the two different cells 701a and 701b can be read at the same time using a single voltage level applied to the CG.

FIG. 8B illustrates the number of operations (loops) required to verify cells according to the example embodiment of FIG. 8A. As shown, half the number of loops are required, as compared to the related art method of FIGS. 7A and 7B.

Figure 9:
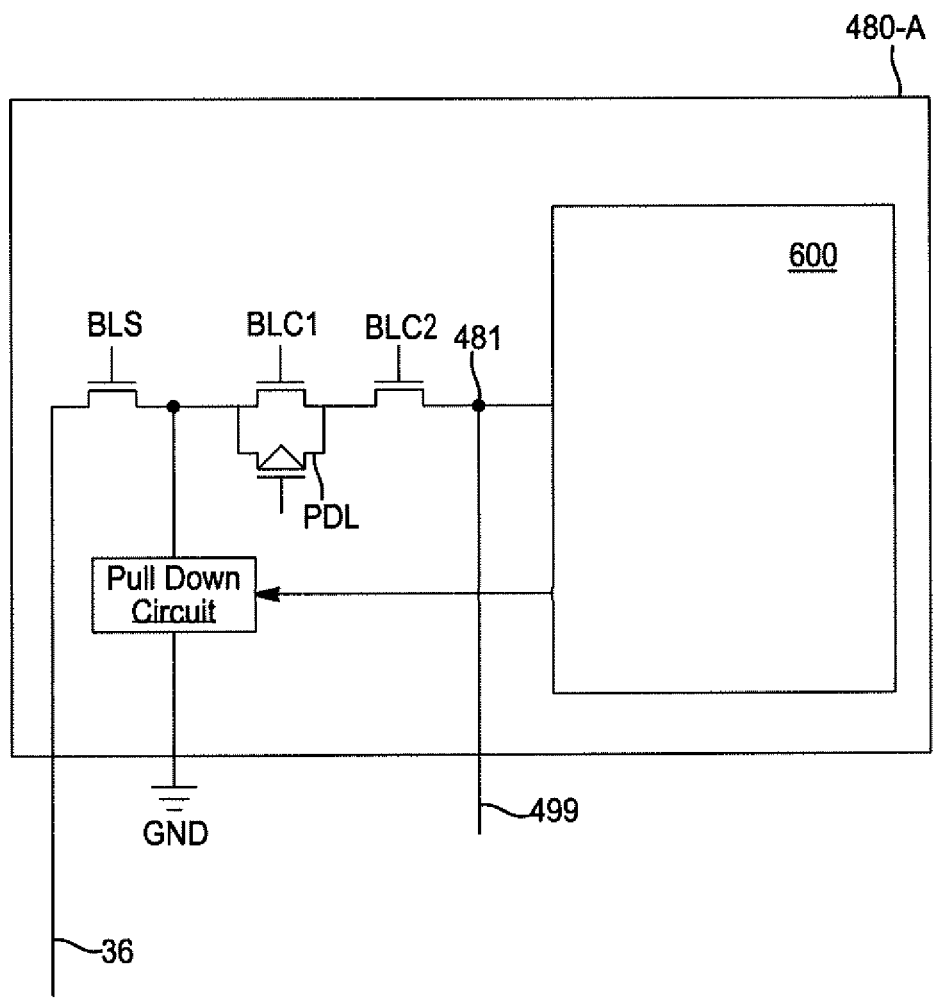
FIG. 9 illustrates a sense module enabling two different BL level biases according to an example embodiment.

FIG. 9 illustrates a sense module 480-A enabling two different BL level biases according to an example embodiment.

The sense module 480-A includes the sense node 481 connected to the bit line 36 and the sense amplifier 600. According to this example embodiment, there is an additional bit line clamp (BLC) and an additional data latch. The sense module 480-A includes a first bit line clamp BLC1, a second bit line clamp BLC2, and a program data latch (PDL) connected to the bit line 36. The PDL may be, for example, a PMOS transistor.

Two different bit line levels are used: a first bias VBLC1 is applied to the first bit line clamp BLC1, and a second bias VBLC2 is applied to the second bit line clamp BLC2. VBLC2 may be higher than VBLC1.

The PDL may be in one of two states: an even state or an odd state. In an odd state, PDL=0, the bias applied to the gate of the PDL is high and the transistor is in an s state. The bias applied to the gate of the PDL in the odd state may be a data latch voltage VDDSA. In this case, the bit line is clamped by BLC1, having a bias VBLC1 lower than that of the BLC2, and a first bias is applied to the bit line 36.

In an even state, PDL=1, the bias applied to the gate of the PDL is low, and the transistor is in an ON state. The bias applied to the gate of the PDL in the even state may be VSS, a ground level. In this case, BLC1 is bypassed, and the bit line 36 is clamped by BLC2, having a higher bias, VBLC2 than that of the BLC1, and a second bias is applied to the bit line.

In this way, different bit line biases can be applied to the bit line 36. FIG. 10 is a chart illustrating the biases applied to the different elements of the sense module 480-A, in different possible odd and even verify and read states, according to an example embodiment.

As shown, program verify includes an even state and an odd state, as noted above. In a program verify odd state, the BLC1 is biased to VBLC1, and BLC2 is biased to VBLC2, where VBLC2 is greater than VBLC1. The PDL is biased to a high bias, VDDSA. Thus, the transistor of the PDL is in an OFF state, and the bit line is clamped by BLC1 to the voltage VBLC1.

In a program verify even state, the BLC1 is biased to VBLC1, and BLC2 is biased to VBLC2, where VBLC2 is greater than VBLC1. The PDL is biased to a low bias, VSS. Thus, the transistor of the PDL is in an ON state, and the bit line is clamped by BLC2 to the voltage VBLC2.

Thus, during the verify operations, the sense module is toggled between odd and even states, such that the bias applied to the bit line 36 is toggled between VBLC1 and VBLC2.

Similarly, in a read odd state, the PDL is biased to a high bias, its transistor is in an OFF state, and the bit line is clamped by BLC1 to the voltage VBLC1. In a read even state, the PDL is biased to a low bias, its transistor is in an ON state, and the bit line is clamped by BLC2 to the voltage VBLC2.

During the erase operation, BL is biased with VDDSA, which is SA power and is not an analog level such as VBLC. So, both VBLC1 and VBLC2 are biased with VTH=VDDSA+Vtn, in order to bypass the VDDSA level to the bit lines while turning off the PDL transistor by applying VDDSA.

Figure 11:
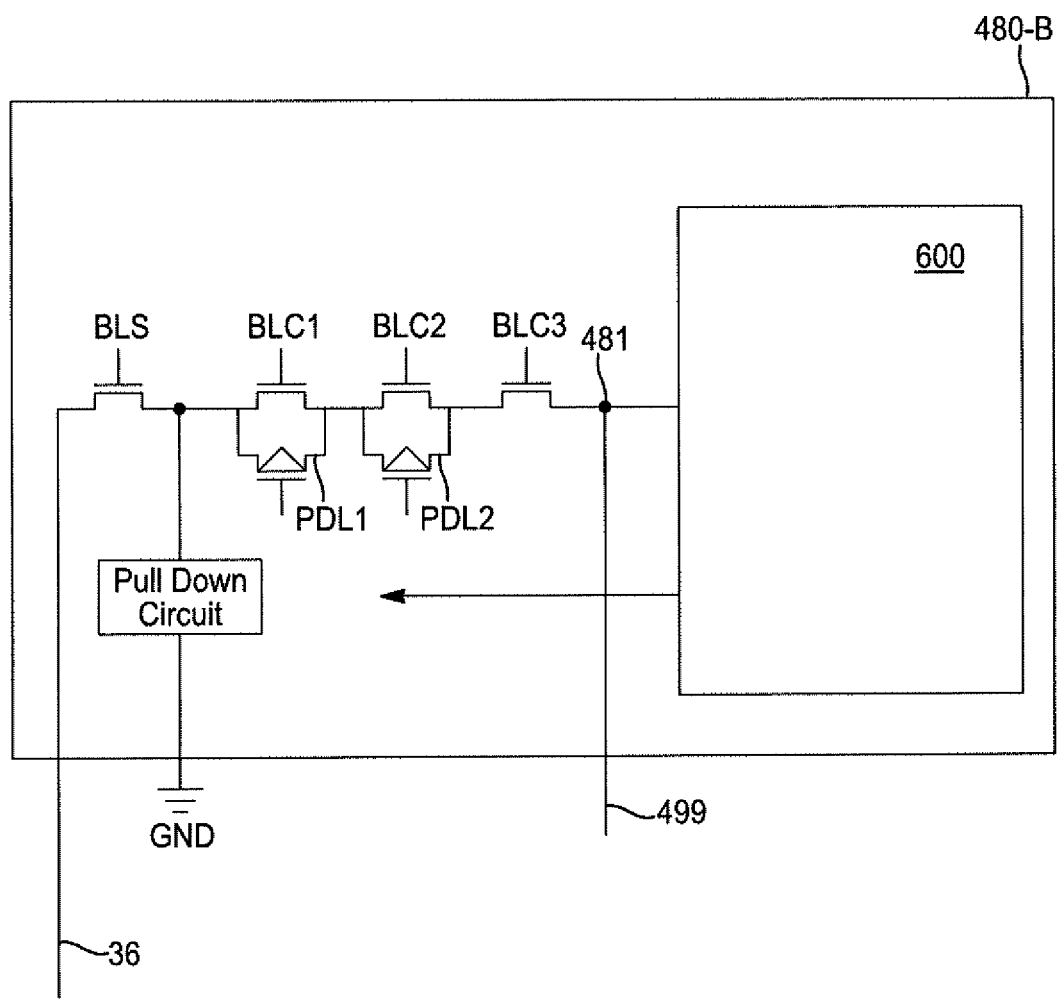
FIG. 11 illustrates a sense module enabling three different BL level biases according to an example embodiment.

FIG. 11 illustrates a sense module 480-B enabling three different BL level biases according to an example embodiment.

The sense module 480-B is analogous to that described above with respect to FIG. 9, and similar elements are not repeatedly described herein. As compared to the sense module 480-A, which includes two bit line clamps and one data latch, the sense module 480-B includes three bit line clamps BLC1, BLC2, and BLC3, and two data latches PDL1 and PDL2.

Three different bit line levels are used: a first bias VBLC1 is applied to the first bit line clamp BLC1, a second bias VBLC2 is applied to the second bit line clamp BLC2, and a third bias VBLC3 is applied to the third bit line clamp BLC3.

PDL1 and PDL2 may each be in one of two states: an even state or an odd state. In an odd state, the bias applied to the gate is high and the transistor is in an OFF state. In an even state, the bias applied to the gate is low, and the transistor is in an ON state.

Three different bit line clamps are illustrated in FIG. 11. However, as would be understood by one of skill in the art, four or more bit line clamps may be included, in order to provide four or more different bit line biases. Likewise, while two program data latches are shown in FIG. 11, three or more may be included.

According to another example embodiment, the sense module 480-A of FIG. 9 may also provide the benefit of enabling a multi-level quick pass write (QPW) operations.

During programming, when the voltage of a storage element that is being programmed approaches the verify target, the programming speed of the storage element is slowed down, to a slow programming mode, such as by raising the associated bit line voltage to a level that is between a nominal program or non-inhibit level (e.g. 0V) and a full inhibit level (e.g. 4-6V). this provides greater accuracy by avoiding large step increases in the threshold voltage. Then, when the voltage reaches the verify target, the storage element is locked out from further programming. This programming technique is referred to as quick pass write (QPW).

Accordingly, it can be seen that when a first bias VBLC1 is applied to the first bit line clamp BLC1, and a second bias VBLC2 is applied to the second bit line clamp BLC2, the architecture of the sense module 480-A can enable multiple QPW levels. Programming can be performed with a "normal" QPW bit line voltage (VQPW) when the bias applied to the gate of the PDL is high and the transistor is in an OFF state, the bit line is clamped by BLC1, having a lower bias VBLC1. Also, programming can be performed with a higher VQPW. When the bias applied to the gate of the PDL is low and the transistor is in an ON state, the bit line is clamped by BLC2, having a higher bias VBLC2. Thus, in this case of biasing the bit line to the higher voltage, the effective Vt is smaller.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A sense circuit connected to a bit line of a memory array, the sense circuit comprising:
   a first voltage clamp disposed on the bit line, the first voltage clamp configured to limit the bit line voltage to a first clamp voltage;
   a second voltage clamp disposed on the bit line, the second voltage clamp configured to limit the bit line voltage to a second clamp voltage, wherein the second clamp voltage is higher than the first clamp voltage; and
   a program data latch disposed on the bit line such that when a transistor of the program data latch is in an OFF state, the bit line is clamped by the first voltage clamp to the first clamp voltage and when the transistor of the program data latch is in an ON state, the bit line is clamped by the second voltage clamp to the second clamp voltage.

2. The sense circuit according to claim 1, wherein the sense circuit further comprises a sense amplifier connected to a sense node of the bit line.

3. The sense circuit according to claim 1, wherein the program data latch is a first program data latch, and the sense circuit further comprises:
   a third voltage clamp disposed on the bit line, the third voltage clamp configured to limit the bit line voltage to a third clamp voltage, wherein the third clamp voltage is higher than the second clamp voltage; and
   a second program data latch disposed on the bit line, such that when the transistor of the first program data latch is in the ON state and a transistor of the second program data latch is in an OFF state, the bit line is clamped by the second voltage clamp to the second clamp voltage, and when the transistor of the first program data latch is in the ON state, and the transistor of the second program data latch is in an ON state, the bit line is clamped by the third voltage clamp to the third clamp voltage.

4. A memory device comprising:
   the memory array of a plurality of memory cells; and
   the sense circuit according to claim 1.

5. The memory device according to claim 4, wherein the memory array is a three-dimensional Not-And (NAND) memory array.

6. The memory device according to claim 4, wherein the memory device has a structure comprising a CMOS bonded to the memory array.

7. A sense circuit connected to a bit line of a memory array, the sense circuit comprising:
   a first voltage clamp circuit configured to limit a voltage on the bit line to a first voltage;

a second voltage clamp circuit configured to limit a voltage on the bit line to a second voltage, higher than the first voltage; and a sense amplifier comprising a clamp circuit, a cell current discriminator circuit and a latch circuit, the sense amplifier configured to sense a conduction current of a memory cell connected to the bit line.

8. The sense circuit according to claim 7, further comprising an isolation transistor, disposed on the bit line and configured to cause one of the first voltage clamp circuit and the second voltage clamp circuit to bias the bit line.

9. The sense circuit according to claim 7, wherein the isolation transistor comprises a data latch.

10. A memory device comprising:
the memory array of a plurality of memory cells; and
the sense circuit according to claim 1.

11. The memory device according to claim 10, wherein the memory array is a three-dimensional Not-And (NAND) memory array.

12. The memory device according to claim 10, wherein the memory device has a structure comprising a CMOS bonded to the memory array.

13. A dual state program verify method comprising, in a sense circuit connected to a bit line of a memory array:
simultaneously:
sensing a conduction current of a first cell of a memory array by biasing a first bit line, connected to the first cell, to a first voltage, and
sensing a conduction current of a second cell of the memory array by biasing a second bit line, connected to the second cell, to a second voltage, less than the first voltage.

14. The method according to claim 13, wherein:
the biasing the first bit line comprises biasing a first voltage clamp, disposed on the first bit line, to the first voltage;
the biasing the second bit line comprises biasing a second voltage clamp, disposed on the second bit line, to the second voltage.

15. The method according to claim 14, wherein:
the biasing the first voltage clamp comprises biasing a program data latch, disposed on the first bit line, to a high data latch voltage; and
the biasing the second voltage clamp comprises biasing a program data latch, disposed on the second bit line, to a low data latch voltage.

16. The method according to claim 13, wherein the method further comprises:

simultaneously with the sensing the conduction current of the first cell and the sensing the conduction current of the second cell: sensing a conduction current of a third cell of the memory array by biasing a third bit line, connected to the third cell, to a third voltage, less than the second voltage.

17. The method according to claim 16, wherein:
the biasing the first bit line comprises biasing a first voltage clamp, disposed on the first bit line, to the first voltage
the biasing the second bit line comprises biasing a second voltage clamp, disposed on the second bit line, to the second voltage; and
the biasing the third bit line comprises biasing a third voltage clamp, disposed on the third bit line, to the third voltage.

18. The method according to claim 16, wherein:
the biasing the first voltage clamp comprises turning off a transistor of a first data latch, disposed on the first bit line;
the biasing the second voltage clamp comprises turning on a transistor of a first data latch, disposed on the second bit line and turning off a transistor of a second data latch, disposed on the second bit line;
the biasing the third voltage clamp comprises turning on a transistor of a first data latch disposed on the third bit line and turning on a transistor of a second data latch disposed on the third bit line.

19. A program verify method comprising:
using a first voltage clamp circuit to clamp a voltage of a bit line of a memory array to a first clamp voltage;
using a sense amplifier comprising a clamp circuit, a cell current discriminator circuit, and a latch circuit to sense a conduction current of a first memory cell connected to the bit line;
using a second voltage clamp circuit to clamp a voltage of the bit line of the memory array to a second clamp voltage, higher than the first clamp voltage, and
using the sense amplifier to sense a conduction current of a second memory cell connected to the bit line.

20. The program verify method according to claim 19, further comprising:
clamping a voltage of the bit line of the memory array to a third clamp voltage, higher than the second clamp voltage, and sensing a conduction current of a third memory cell connected to the bit line.

* * * * *